US010027315B2

(12) United States Patent
Raimondi et al.

(10) Patent No.: US 10,027,315 B2
(45) Date of Patent: Jul. 17, 2018

(54) PWM MODULATOR

(71) Applicant: STMicroelectronics S.r.l., Agrate Brianza (IT)

(72) Inventors: Marco Raimondi, Busto Garolfo (IT); Edoardo Botti, Vigevano (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/431,374

(22) Filed: Feb. 13, 2017

(65) Prior Publication Data

US 2017/0155381 A1    Jun. 1, 2017

Related U.S. Application Data

(62) Division of application No. 14/592,364, filed on Jan. 8, 2015, now Pat. No. 9,595,946.

(30) Foreign Application Priority Data

Jan. 17, 2014 (IT) .............................. MI2014A0055

(51) Int. Cl.
| H03K 5/01 | (2006.01) |
| H03K 5/1252 | (2006.01) |
| H03K 7/08 | (2006.01) |
| H03K 4/08 | (2006.01) |
| H03F 1/32 | (2006.01) |
| H03F 3/217 | (2006.01) |

(52) U.S. Cl.
CPC ............ *H03K 5/1252* (2013.01); *H03F 1/32* (2013.01); *H03F 3/217* (2013.01); *H03K 4/08* (2013.01); *H03K 5/01* (2013.01); *H03K 7/08* (2013.01)

(58) Field of Classification Search
CPC .. H03K 5/01; H03K 7/08; H03K 5/02; H03K 5/12; H03K 5/1252; H03K 4/08; H03F 1/26; H03F 1/32; H03F 3/217; H03F 1/3241

See application file for complete search history.

(56) References Cited

U.S. PATENT DOCUMENTS

| 6,016,075 | A | 1/2000 | Hamo |
| 6,307,431 | B1 | 10/2001 | Botti et al. |
| 6,346,852 | B1 | 2/2002 | Masini et al. |
| 7,541,869 | B2 | 6/2009 | Adduci et al. |
| 7,948,281 | B2 | 5/2011 | Mendenhall |
| 2008/0284508 | A1 | 11/2008 | Walker et al. |
| 2010/0079207 | A1 | 4/2010 | Tai |

OTHER PUBLICATIONS

Adduci et al., "PWM Power Audio Amplifier With Voltage/Current Mixed Feedback for High-Efficiency Speakers," IEEE Transactions on Industrial Electronics, vol. 54, No. 2, Apr. 2007, pp. 1141-1149.
Yu, et al., "A low THD analog Class D amplifier based on self-oscillating modulation with complete feedback network," IEEE International Symposium on Circuits and Systems, May 24, 2009, pp. 2729-2732.

*Primary Examiner* — Jung Kim
(74) *Attorney, Agent, or Firm* — Slater Matsil, LLP

(57) ABSTRACT

A method is for reducing pulse skipping from a characteristic affecting a modulating signal input to an integrator of a pulse width modulation (PWM) modulator, together with a square wave carrier signal for generating a triangular waveform of the PWM modulator. The method may include creating a broad synchronous peak at vertexes of the triangular waveform output by the integrator.

19 Claims, 6 Drawing Sheets

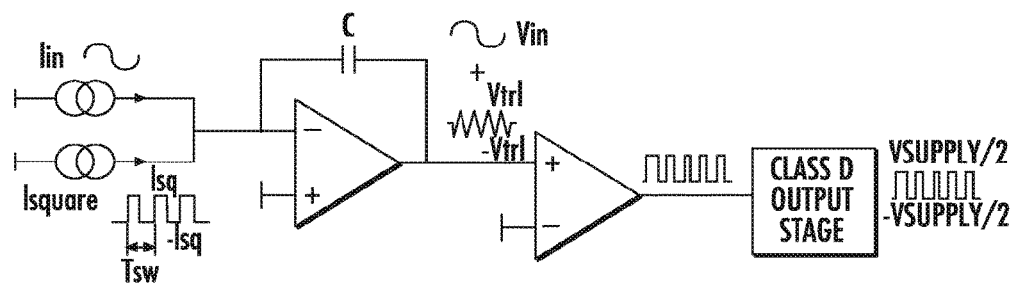
FIG. 1
*(PRIOR ART)*
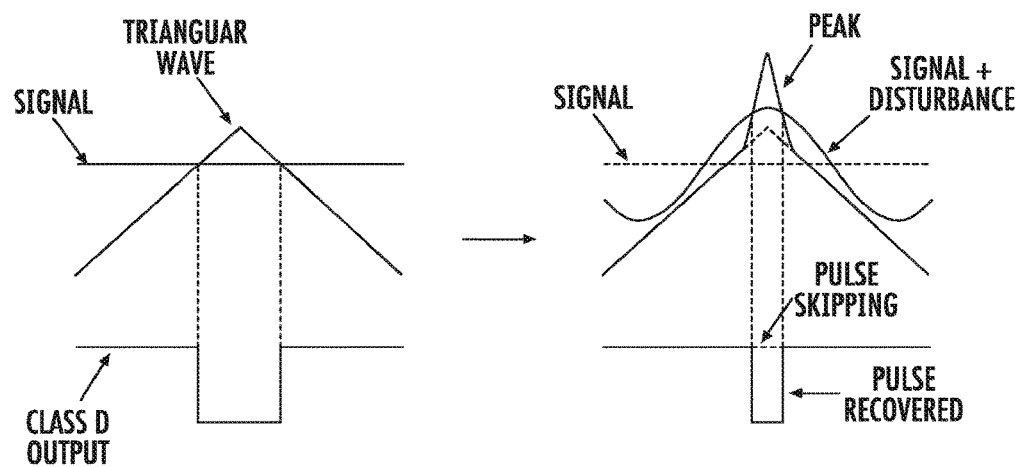
FIG. 2A
FIG. 2B

PWM MODULATOR

CROSS-REFERENCE TO RELATED APPLICATION

This application is a divisional of U.S. patent application Ser. No. 14/592,364, filed on Jan. 8, 2015, and entitled "PWM Modulator," which application claims the benefit of Italian Patent Application No. MI2014A000055, filed on Jan. 17, 2014, which applications are hereby incorporated herein by reference.

TECHNICAL FIELD

This disclosure relates to pulse width modulation (PWM) modulators and, more particularly, to a negative feedback system employing class D amplifiers.

BACKGROUND

The functioning principle of a class D amplifier uses a carrier signal of a relatively high frequency modulated by an input signal (Iin) to be amplified, of a frequency generally much smaller than the carrier frequency, and demodulates the amplified high frequency output signal. Generally, the frequency of the carrier signal is one or more orders of magnitude greater than the frequency of the modulated input signal.

An appropriate modulation for these applications is PWM, wherein the carrier signal being modulated is a square wave (Isquare or Isq) of a fixed frequency. The duty-cycle of the square wave is modified as a function of the input signal to be amplified. This is implemented by a triangular voltage waveform (+Vtri−Vtri) generated by injecting the square wave current signal into the virtual ground node of an integrating stage of the input signal (Iin) to be amplified, and which is then fed to an input of a successive fixed threshold comparator stage to generate the PWM modulated square wave signal that is amplified by a class D output stage, as shown in the circuit diagram of FIG. 1. Notably, the information content of the input signal may then be extracted from the amplified PWM modulated signal by way of a passive low-pass LC filter (called also a demodulation filter).

SUMMARY

According to a first circuit implementation of the method of this disclosure, effective synchronous peaks are introduced by generating an auxiliary clock having a certain phase lead in respect of the clock that generates the square wave carrier signal of the PWM modulator. Hence, a derivative signal thereof with a dedicated high pass filter, characterized by sharp current peaks synchronously ahead of and immediately following the rising and falling fronts of the square wave carrier signal, is injected together with the square wave carrier signal and the modulating input signal into the input node of the op-amp integrating stage of the PWM modulator to generate at the output of the op-amp integrator a triangular wave with a pronounced and relatively broad peak at its vertex.

According to a possible alternative circuit implementation of the method of this disclosure, generation of a dedicated auxiliary clock and introduction of a dedicated high pass filter in an input line to the op-amp integrator of the PWM modulator, of a signal having sharp peaks synchronous with the fronts of the square wave carrier signal, may be avoided and with it also an undesirable increase of power consumption and risks of spurious switching in the PWM modulated output signal. According to such an alternative embodiment of simplicity, a resistor is introduced in series to the capacitor present in the feedback loop of the op-amp integrator, and the resistance is adapted to cancel the right hand side zero in the transfer function of the integrator, thus effectively eliminating or reducing a risk of spurious switching due to changes of slope in the triangular voltage waveform output by the integrator.

BRIEF DESCRIPTION OF THE DRAWINGS

FIG. 1 is a basic circuit diagram of a switching amplifier with a class D output stage, according to the prior art.

FIGS. 2A-2B illustrate the pulse skipping phenomenon caused by disturbances or oscillations when operating near saturation conditions of modulation, and how the method of this disclosure recovers the otherwise lost pulse.

DETAILED DESCRIPTION

Figure 3:
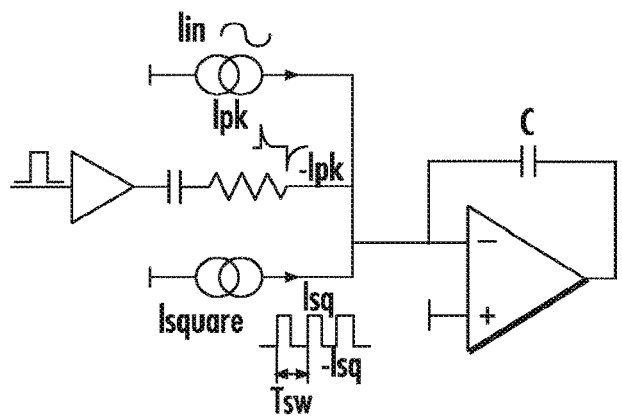
FIGS. 3 and 4 illustrate a first basic circuit implementation of the method of this disclosure of creating peaks on the vertex of the triangular waveform to overcome the pulse skipping problem, according to the present disclosure.

The ensuing description of the embodiment depicted in the drawings has solely illustrative purposes and is not to be intended as limitative of the practice of the present disclosure to the illustrated embodiments. As a matter of fact the present disclosure may be practiced with other functionally equivalent circuit structures though remaining within its scope as defined in the annexed claims.

A problem may arise when a PWM modulator approaches saturation conditions of modulation because of an exceptionally strong modulating signal (of great amplitude). In this operation condition, high frequency disturbances or oscillations may cause a phenomenon known as of "pulse skipping" earlier than the normal pulse skipping intervention, and this may lead to malfunctioning of the system with modulating signals of relatively large dynamics or when the system is exposed to strong disturbances.

An approach to the anomalous pulse skipping problem, the applicant has verified the fact that a PWM modulator in a system with negative feedback loops, like a class D amplifier, just to mention a typical example of negative feedback system, may not require that the triangular wave commonly generated by an integrator of the modulating input signal and the square wave carrier signal be very precise and specially so in the operating region near saturation of the dynamic range of modulation. Applicant has found that the anomalous pulse skipping phenomenon may be effectively countered by modifying the triangular waveform that modulates the square wave signal by adding or creating a synchronous peak on the vertex of the triangular waveform such as to prevent anomalous pulse skipping that may be caused by disturbances or oscillations when operating with a modulating input signal of an amplitude approaching the saturation limit of a comparison of the sum of the modulating input signal and of the triangular waveform with the fixed threshold of the output comparator stage of the PWM modulator.

FIG. 2A illustrates exemplary typical signal waveforms of a PWM modulator when operating near the saturation condition of modulation. When a disturbance superimposes itself on the modulating signal, it may create a situation of pulse skipping as depicted in FIG. 2B. According to the method of this disclosure, creation of a peak on the vertex of the triangular waveform (practically prolonging it) reduces or prevents the phenomenon of pulse skipping, practically recovering the pulse, that without the addition of the synchronous peak on the vertex of the triangular waveform, would be missed.

A first basic circuit implementation of the method of this disclosure of creating peaks on the vertex of the triangular waveform to overcome the pulse skipping problem is illustrated in FIG. 3. An auxiliary clock signal having a certain phase lead with respect to the clock of the generator of the square wave carrier signal is generated by ordinary circuit methods of generation of a modified clock from the main clock used for generating the square wave carrier signal.

The auxiliary clock signal fed to a logic gate and a high pass filter produces a derivative signal characterized by narrow spikes separated by an interval correspondent to the phase lead of the auxiliary clock that is injected in the input node of the op-amp integrator of the PWM modulator, together with the square wave carrier signal and the modulating input signal.

Figure 4:
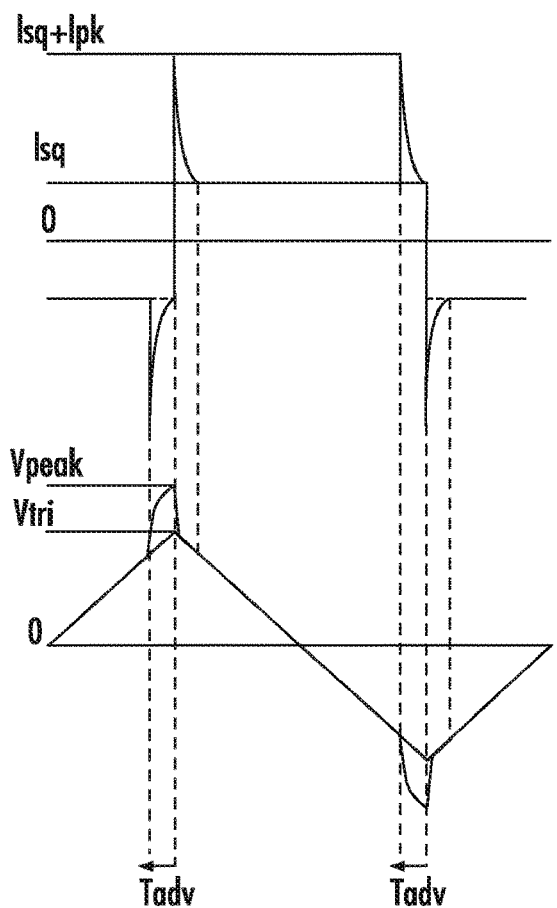
Figure 5A:
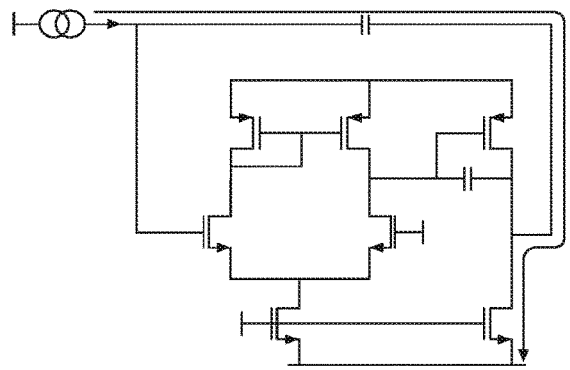
FIGS. 5A-5B show the common circuit configuration with a drain output of the op-amp of the integrator and the increment of current absorption due to the added current peaks, according to the present disclosure.
Figure 5B:
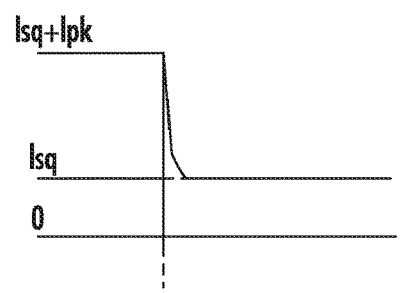

FIG. 4 shows the relevant waveforms and the resultant triangular waveform having a pronounced broad peak at the vertex of the triangular wave. The relative broadness of the peak that is created on the vertex of the triangle waveform is in this case the result of the integration that the added slender current peaks undergo in the integrating stage. The current capability of the output stage of the operational amplifier fixed by the bias current should be dimensioned not only for the square wave carrier signal but also for the current peaks added there to, as depicted in FIGS. 5A-5B.

Figure 6:
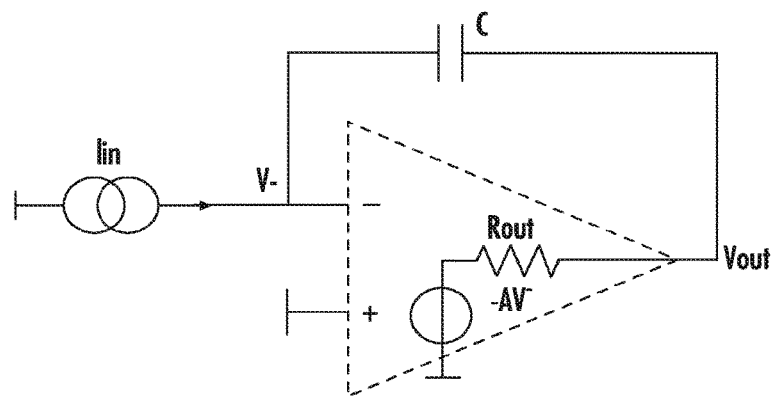
FIGS. 6 and 7 illustrate how the significantly higher output impedance of the op-amp of the integrator because of a significant back shifting of the right hand side zero of the transfer function of the op-amp integrator, introduces a risk of spurious switching, according to the present disclosure.

A high output impedance of the op-amp favors a shifting back of the right hand zero of the transfer as inferable from the transfer function of the integrator at a high frequency:

$$\frac{V_{out}}{I_{in}} = -\frac{A}{1+A} \cdot \frac{1 - sCR_{out}/A}{sC} \xrightarrow{s \to \infty} \frac{R_{out}}{1+A}$$

as depicted in FIG. 6. The above discussed requisites on the intrinsic characteristics of the op-amp of the integrator may favor conditions where the addition of sharp current peaks onto the square wave carrier signal could produce abrupt slope changes in the output triangular waveform with an associated risk of spurious switching, as graphically depicted in FIG. 7. However, a proper design of the op-amp such as to lower the output impedance will render such a risk negligible.

Figure 8:
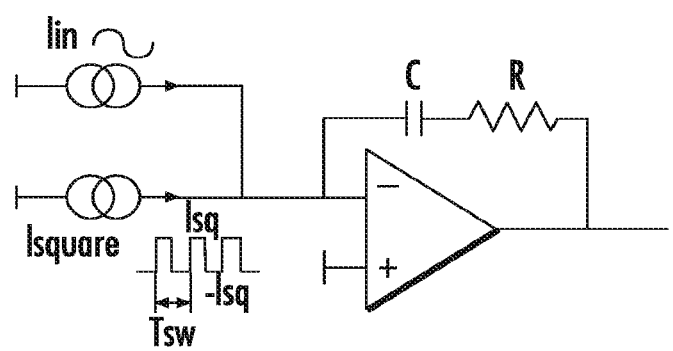
FIG. 8 illustrates a possible alternative basic embodiment of the method of this disclosure of creating peaks on the vertex of the triangular waveform to overcome the pulse skipping problem, according to the present disclosure.
Figure 9A:
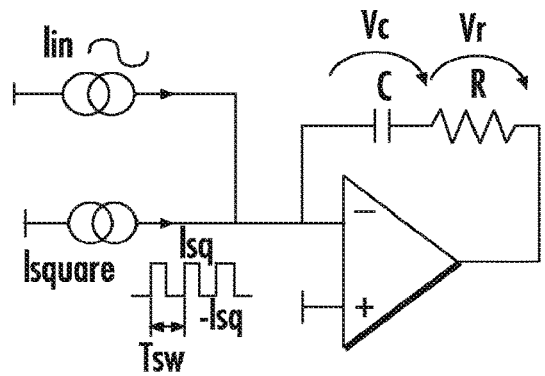
FIGS. 9A-9E illustrate the resultant waveforms of the integrator according to the circuit of FIG. 8.
Figure 9B:
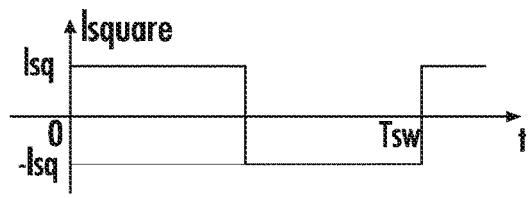
Figure 9C:
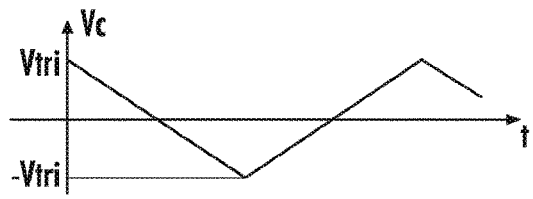
Figure 9D:
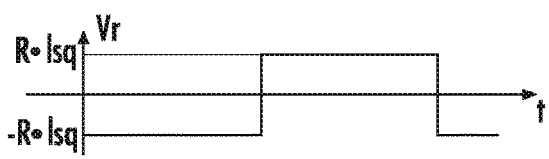
Figure 9E:
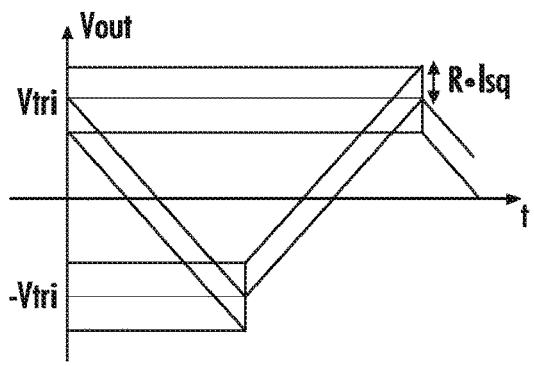

An alternative circuit implementation of the method of this disclosure is depicted in FIG. 8. This alternative approach to create a synchronous broad peak at the vertex of the triangular waveform reduces or eliminates the complication of a synchronizing auxiliary clock signal, a buffer logic gate, and a capacitor for the high pass filter of the preceding circuit embodiment, and may not impose critical design refinements of the op-amp of the integrator nor an increased bias current.

The significant waveforms of the circuit are depicted in FIGS. 9A-9E, where the basic circuit of the integrator is also reproduced without any modulating input signal to be class D amplified, to render more readily observable the characteristics of this embodiment of the PWM modulator of this disclosure. Introduction of a resistance R in series to the integrating capacitance C of the feedback loop of the op-amp integrator has the effect of making the output voltage Vout equal to the sum of the voltages Vc and Vr, respectively on the capacitor and on the resistor in the feedback loop. The Vr voltage tracks the waveform of the injected square wave carrier signal with the effect of introducing the desired peaks on the triangular waveform produced by the integration performed by the capacitance C.

The shift in opposite direction of the downward and upward slopes of the triangular waveform that creates the desired peak at the vertex has been found not to introduce any significant distortive effect of the demodulated amplified signal output by the class D amplifier and to be reliably effective in preventing early pulse skipping intervention.

In some embodiments, the value of the resistor R introduced in the feedback loop, in series with the integrating capacitor C, is chosen such as to cancel the right hand side zero in the transfer function of the op-amp integrator. In other words, the resistor introduced in the feedback loop of the op-amp integrator should have an effect similar, changing only those things that need to be changed, to that of a so called "nulling resistor" connected in series with a compensation capacitance when exploiting the Miller effect in two-stage op-amps.

Figure 10:
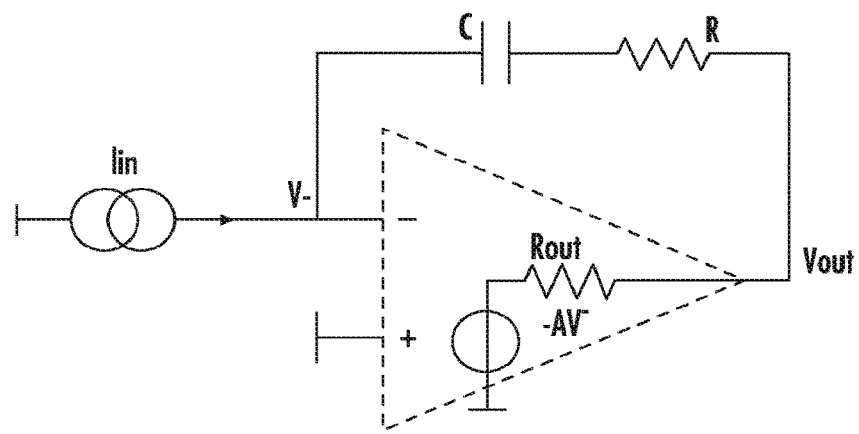
FIG. 10 shows the modified transfer function of the integrator, according to the circuit embodiment of FIG. 8.

With reference to FIG. 10, such a condition may be expressed by the relationship:

$$\frac{V_{out}}{I_{in}} = -\frac{A}{1+A} \cdot \frac{1 + sC \cdot (R - R_{out}/A)}{sC} \xrightarrow{s \to \infty} -\frac{A}{1+A} \cdot (R - R_{out}/A).$$

Figure 7:
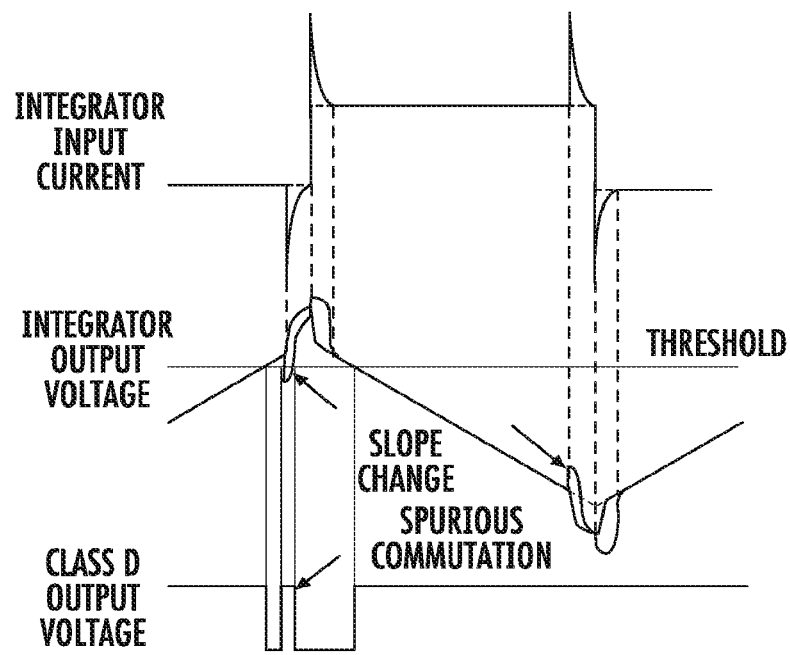

In this way, the problem of possible spurious switching due to slope variations in the triangular waveform produced in PWM modulators, discussed in relation to the first circuit embodiment of FIG. 3 and depicted in FIG. 7, may be reduced.

Pulse width modulation in systems with negative feedback loops like class D amplifiers, just to mention a typical example, may not typically require that the triangular wave be very precise specially in the region near saturation of the dynamic range of modulation. Resiliency against near clipping disturbances, that is in the operating zone most sensitive to noise, by deliberately creating a synchronous broad peak at the vertexes of the triangular waveform, practically prolonging the cusp, is effectively enhanced. Different possible circuit implementations of the method are disclosed including a simplified embodiment whereby such an effective synchronous peak at vertexes is created by shifting in opposite directions the upward and the downward slopes of the triangular waveform.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure and modifications and/or additions may be made by those skilled in the art to the herein above disclosed basic embodiment while remaining within the scope of the following claims.

What is claimed is:

1. A method, comprising:
   generating, using an integrator of a pulse width modulation (PWM) modulator, a triangular waveform based at least on a square wave carrier signal received at an input node of the integrator; and
   generating a synchronous peak at one or more vertexes of the triangular waveform by injecting, into the input node of the integrator, a derivative signal of an auxiliary clock signal, wherein the auxiliary clock signal is configured to have a phase lead with respect to a clock signal of a circuit configured to generate the square wave carrier signal.

2. The method of claim 1, wherein generating the synchronous peak at one or more vertexes of the triangular waveform comprises shifting a downward slope of the triangular waveform and an upward slope of the triangular waveform in opposite directions.

3. The method of claim 1, wherein the synchronous peak at one or more vertexes of the triangular waveform is configured to reduce pulse skipping caused by a characteristic affecting a modulating signal received at the input node of the integrator and configured to modulate the square wave carrier signal.

4. The method of claim 3, wherein the characteristic comprises a disturbance or an oscillation of the modulating signal.

5. A method, comprising:
   generating, by a circuit comprising a high pass filter, a derivative signal of a first clock signal;
   generating, using an integrator, a triangular waveform based on the derivative signal, a modulating signal, and a square wave carrier signal received at an input node of the integrator; and
   comparing the triangular waveform against a threshold.

6. The method of claim 5, wherein a frequency of the square wave carrier signal is greater than a frequency of the modulating signal.

7. The method of claim 6, further comprising generating, using a square wave generator clocked by a second clock signal, the square wave carrier signal, wherein the first clock signal is configured to have a phase lead with respect to the second clock signal.

8. The method of claim 7, wherein the derivative signal is characterized by consecutive spikes separated by a time interval indicative of the phase lead.

9. The method of claim 5, wherein generating the triangular waveform comprises creating a synchronous peak at vertexes of the triangular waveform based on the derivative signal.

10. The method of claim 9, wherein creating the synchronous peak comprises shifting a downward slope and an upward slope of the triangular waveform in opposite directions.

11. The method of claim 5, further comprising generating a pulse-width modulated square wave carrier signal based on the comparing.

12. A method, comprising:
    receiving, at an input node of an integrator, a modulating signal and a square wave carrier signal, the square wave carrier signal having a frequency greater than a frequency of the modulating signal;
    generating an auxiliary clock signal having a phase lead with respect to a clock signal associated with the square wave carrier signal;
    generating, by a circuit comprising a logic gate, a derivative signal of the auxiliary clock signal;
    generating, by the integrator, a triangular waveform based on the derivative signal, the modulating signal, and the square wave signal received at the input node of the integrator; and
    comparing, by a comparator, the triangular waveform with a fixed threshold.

13. The method of claim 12, further comprising generating, by the comparator, a pulse width modulated square wave carrier signal based on the comparing.

14. The method of claim 12, wherein the integrator has a drain output configuration.

15. The method of claim 12, generating the triangular waveform comprises generating synchronous peak at one or more vertexes of the triangular waveform.

16. The method of claim 15, wherein generating synchronous peaks at one or more vertexes of the triangular waveform comprises shifting a downward slope of the triangular waveform and an upward slope of the triangular waveform in opposite directions.

17. The method of claim 15, wherein the synchronous peak at one or more vertexes of the triangular waveform is configured to reduce pulse skipping caused by an oscillation affecting the modulating signal received at the input node of the integrator.

18. The method of claim 12, wherein the circuit further comprises a high pass filter.

19. The method of claim 1, wherein the auxiliary clock signal is distinct from the square wave carrier signal and the triangular waveform.

* * * * *